United States Patent
Nagasawa et al.

(10) Patent No.: US 6,703,288 B2
(45) Date of Patent: Mar. 9, 2004

(54) COMPOUND CRYSTAL AND METHOD OF MANUFACTURING SAME

(75) Inventors: Hiroyuki Nagasawa, Hachiouji (JP); Kuniaki Yagi, Ome (JP); Takamitsu Kawahara, Kawasaki (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 10/140,187

(22) Filed: May 8, 2002

(65) Prior Publication Data

US 2003/0040167 A1 Feb. 27, 2003

(30) Foreign Application Priority Data

May 10, 2001 (JP) .......................... 2001-139926

(51) Int. Cl.$^7$ .............................................. H01L 21/20
(52) U.S. Cl. ...................... 438/483; 438/503; 438/507; 438/931
(58) Field of Search ................................ 438/483, 486, 438/478, 503, 504, 507, 931

(56) References Cited

U.S. PATENT DOCUMENTS

| | | | | |
|---|---|---|---|---|
| 4,912,064 A | * | 3/1990 | Kong et al. .................. | 437/100 |
| 4,946,547 A | * | 8/1990 | Palmour et al. ............. | 156/643 |
| 5,122,223 A | * | 6/1992 | Geis et al. .................... | 156/603 |
| 5,230,768 A | * | 7/1993 | Furukawa et al. ........... | 156/612 |
| 5,248,385 A | * | 9/1993 | Powell ......................... | 156/645 |
| 5,471,946 A | | 12/1995 | Scholz et al. | |
| 5,501,173 A | * | 3/1996 | Burk et al. .................... | 117/84 |
| 5,915,194 A | * | 6/1999 | Powell et al. ................ | 438/478 |
| 6,051,849 A | | 4/2000 | Davis et al. | |
| 6,184,144 B1 | | 2/2001 | Lo | |
| 6,596,080 B2 | * | 7/2003 | Kawahara et al. ........... | 117/106 |
| 2003/0047129 A1 | * | 3/2003 | Kawahara et al. ............ | 117/2 |

FOREIGN PATENT DOCUMENTS

| | | | |
|---|---|---|---|
| EP | 0743727 A1 | * 11/1996 | ............. H01S/3/19 |
| JP | 6-41400 | 6/1994 | |
| JP | 7-335562 | 12/1995 | |

OTHER PUBLICATIONS

H. Nagasawa, et al., Materials Science Forum, Vols. 389–393, pps. 319–322, "Heteroepitaxial Growth and Characteristics of 3C–SiC on Large–Diameter Si(001) Substrates," 2002.

A. Nagayama, et al., Phys. Stat. Sol. (a), vol. 176, pps. 513–517, "Substrate Misorientation Dependence of the Hexagonal Phase Inclusion in Cubic GaN Films Grown by Metalorganic Vapor Phase Epitaxy," 1999.

(List continued on next page.)

Primary Examiner—Tuan H. Nguyen
Assistant Examiner—David S Blum
(74) Attorney, Agent, or Firm—Oblon, Spivak, McClelland, Maier & Neustadt, P.C.

(57) ABSTRACT

Provided are a compound semiconductor crystal substrate capable of reducing planar defects such as twins and antiphase boundaries occurring in epitaxially grown crystals without additional steps beyond epitaxial growth, and a method of manufacturing the same. A compound single crystal substrate, the basal plane of which is a nonpolar face, with said basal plane having a partial surface having polarity (a partial polar surface). Said partial polar surface is a polar portion of higher surface energy than said basal plane. A method of manufacturing the compound single crystal substrate, comprising the steps of: epitaxially growing a compound single crystal in the normal direction on a basal plane of a compound single crystal substrate wherein the basal plane is a nonpolar face and has a partial polar surface in a portion thereof, and either cutting the compound single crystal layer that has been grown in parallel to the basal plane, or removing at least said substrate to obtain a compound single crystal block, a basal plane of which is a nonpolar face only having a partial polar surface with the highest surface energy in a portion thereof.

2 Claims, 3 Drawing Sheets

OTHER PUBLICATIONS

C. Long, et al., Journal of Applied Physics, vol. 86, No. 5, pp. 2509–2515, XP–000934896, "Structural Defects in 3C–SiC Grown on Si by Supersonic Jet Epitaxy", Sep. 1, 1999.

Y. V. Melnik, et al., Diamond and Related Materials, vol. 6, No. 10, pp. 1532–1535, XP–004096982, "Structrual Properties of GaN Grown on SiC Substrates by Hydride Vapor Phase Epitaxy", Aug. 1, 1997.

H. D. Cho, et al., Journal of Crystal Growth, vol. 175–175, No. 3001, pp. 125–128, XP–004091279, "Zinc Blende GaN Grown by Radio Frequency Plasma Assisted Molecular Beam Epitaxy", May 1, 1997.

* cited by examiner

Epitaxially growing

Fig. 3

COMPOUND CRYSTAL AND METHOD OF MANUFACTURING SAME

TECHNICAL FIELD

The present invention relates to a compound single crystal substrate employed as a substrate in semiconductor devices such as power semiconductor devices, light-emitting devices, and integrated circuits; a method of manufacturing this compound single crystal substrate; a laminate employing this compound single crystal substrate; and a method of manufacturing the laminate. In particular, the present invention relates to a low-defect density compound single crystal substrate desirable from the aspects of improving yield in the course of manufacturing semiconductor devices and the characteristics thereof; a method of manufacturing the same; and a method of employing the same.

BACKGROUND OF THE INVENTION

Conventionally, the substrates employed in semiconductor devices are in the form of ingots manufactured from compound semiconductor crystals, for example. Examples of widely employed methods of manufacturing ingots are the horizontal Bridgman method, Czochralski method, sublimation method, and zone melting method. The ingot obtained is generally cut into plates, externally processed, surface ground, and employed as a semiconductor wafer. Further, when manufacturing high-performance semiconductor devices, a film with few crystal defects and of low impurity concentration is epitaxially grown on a compound semiconductor substrate that has been processed from an ingot.

Further, it is sometimes difficult to manufacture a compound semiconductor as an ingot, and it is sometimes difficult to obtain large-area ingots for technical and cost reasons. In such cases, the means of forming an epitaxial layer of a desired compound semiconductor crystal on a relatively readily available semiconductor wafer in the form of an Si substrate or the like (heteroepitaxy) is sometimes employed.

However, in heteroepitaxy, there is mismatching of the lattice constants of the substrate crystal and the crystal grown on the layer above it. Thus, crystal defects resulting from this mismatch develop at the interface of the substrate crystal and the crystal grown over it. In particular, in compound semiconductor crystals, a greater variety of crystal defects develop than in crystals comprised of a single element, such as Planar defects (Anti-Phase boundaries) developing at boundaries between regions where the stacking order of constituent elements is reversed and defects (twins) developing where the crystal is partially rotated. Such crystal defects must be reduced to the extent possible in the manufacturing of semiconductor devices because, for example, they decrease breakdown voltage and increase leakage current. However, because primarily low-surface-energy planar defects grow, particularly during compound single crystal growth, they have been difficult to eliminate thus far.

Even in the case of homoepitaxially growing in which homogeneous crystals are grown, propagative planar defects propagate in the homoepitaxially grown layers of the substrate that is grown (for example, when the surface energy of the polar face exposed at the surface is low), making it difficult to obtain a homoepitaxially grown layer suitable as an underlayer in power semiconductor devices and the like.

For example, when silicon carbide (SiC) grows heteroepitaxially on an Si substrate, planar defects (anti-phase boundaries and twins) develop in an SiC film. One method of reducing such planar defects, comprising the step of providing a growth region on a grown substrate and a step of growing a single crystal silicon carbide crystal on the growth region to a thickness identical to or exceeding the natural thickness of the substrate along the orientation of the growth surface, has been proposed (Japanese Examined Patent Publication (KOKOKU) Heisei No. 6-41400). However, the two types of reverse phase regions in the SiC have a characteristic of expanding in a mutually perpendicular orientation as the thickness of the SiC film increases. Thus, it is impossible to effectively reduce the anti-phase boundary no matter how long heteroepitaxial growth is continued.

Another method of eliminating the mismatching of crystal lattices is to insert a new layer (buffer layer) having a lattice constant falling between those of the substrate and the layer grown over it. However, for example, when growing SiC on a Si substrate, no substance capable of serving as buffer layer is known. As a result, when SiC is grown directly on a Si substrate, there is 20 percent of mismatching between lattice constants. This is the main cause of planar defects in epitaxially grown SiC layers.

In the growth of gallium nitride (GaN), to eliminate high-density crystal defects generated between heterogeneous substrates, a layer temporarily blocking GaN growth is provided part way through the growth process. It has been proposed to reduce crystal defects growing in a vertical direction by utilizing lateral growth of GaN above an opening provided in part of the growth-blocking layer, wherein the GaN has selectively been grown through the opening (U.S. Pat. No. 6,051,849). However, this method requires the steps of forming a GaN growth-blocking layer and making a hole in it, which increases cost. Further, since crystal defects have the property of propagating unchanged into the GaN over the opening, crystal defects are not completely eliminated.

Accordingly, the objects of the present invention are to provide a compound semiconductor crystal substrate for epitaxial growth capable of reducing planar defects such as twins and anti-phase boundary occurring in epitaxially grown crystals without additional steps beyond epitaxial growth, and to provide a method of manufacturing the same.

A further object of the present invention is to provide a laminate employing the above-described compound semiconductor crystal substrate and a method of manufacturing the same.

SUMMARY OF THE INVENTION

The present invention relates to a compound single crystal substrate, a basal plane of which is a nonpolar face and said basal plane has a partial surface having polarity (hereinafter referred to a partial polar surface), characterized in that said partial polar surface is a polar portion with surface energy higher than said basal plane.

In this compound single crystal substrate, the compound is preferably a group IV—IV compound, group III–V compound, or group II–VI compound; the compound single crystal is preferably cubic, said basal plane is (001) face, and said partial polar surface is (111) face; the compound single crystal is preferably hexagonal, said basal plane is (1,1,−2,0) or (1,−1,0,0) face, and said partial polar surface is {0001} faces; the compound single crystal is preferably cubic silicon carbide, said basal plane is (001) face, and said partial polar surface is (111) Si-face; the compound single crystal is preferably cubic gallium nitride, said basal plane is (001) face, and said partial polar surface is (111) Ga-face; the compound single crystal is preferably hexagonal silicon carbide, said basal plane is (1,1,-2,0) or (1,-1,0,0) face and said partial polar surface is (0001) Si-face; and the compound single crystal is preferably hexagonal gallium nitride, said basal plane is (1,1,-2,0) or (1,-1,0,0) face, and said partial polar surface is (0001) Ga-face.

The present invention further relates to a method of manufacturing the above-mentioned compound single crystal substrate comprising the steps of: epitaxially growing a compound single crystal in the normal direction on a basal plane of a compound single crystal substrate wherein the basal plane is a nonpolar face and has a partial polar surface in a portion thereof, and either cutting the compound single crystal layer that has been grown in parallel to the basal plane, or removing at least said substrate to obtain a compound single crystal block, a basal plane of which is a nonpolar face only having a partial polar surface with the highest surface energy in a portion thereof.

The present invention still further relates to a laminate having, on the basal plane of the above-mentioned compound single crystal substrate, a compound single crystal layer that is homogeneous or heterogeneous with said substrate, characterized in that the single crystal constituting said compound single crystal layer has crystallinity and a spatial lattice that are homogeneous with those of said substrate and has a nonpolar basal plane, and an area occupied by a partial surface having surface polarity in said nonpolar basal plane is 0.1 percent or less of the total area of the basal plane.

Further the present invention relates to a method of manufacturing a compound single crystal laminate, characterized in that a compound single crystal layer that is homogeneous or heterogeneous with the compound constituting said single crystal substrate is epitaxially grown on the basal plane of the above-mentioned compound single crystal substrate.

The compound single crystal substrate of the present invention has a nonpolar face as a basal plane, this basal plane has a surface with surface polarity (partial polar surface) in a portion thereof, and the partial polar surface is a polar part with surface energy higher than that of the basal plane.

In the compound single crystal substrate of the present invention, the basal plane is a nonpolar face. Here, the term "basal plane" refers to the plane serving as the base for crystal growth. The envelope of the growth surface is parallel to the basal plane and grows in a normal direction of the basal plane.

The compound single crystal is comprised of multiple elements. For example, in the case of silicon carbide (SiC), these are silicon (Si) and carbon (C), and in the case of gallium nitride (GaN), these are nitrogen (N) and gallium (Ga). Normally, the electronegativity of the multiple elements constituting the compound single crystal differs. Thus, for example, in the case of a compound single crystal comprised of two elements such as the above-mentioned silicon carbide (SiC) or gallium nitride (GaN), the surface on which only one of the elements is exposed has polarity dependent upon the electronegativity of the exposed element. Such a surface is called a polar face. By contrast, the surface on which both of the elements constituting the compound single crystal are exposed is electrically neutral. Such a surface is called a nonpolar face. The compound single crystal substrate of the present invention has a basal plane that is a nonpolar face, where a portion of the basal plane comprises a surface (partial polar surface) having surface polarity.

In the present invention, a nonpolar face is employed as the basal plane so that the polar face never becomes parallel to the nonpolar face. One of the problems to be solved by the present invention is how to eliminate the polar face present in the surface. The reason is that if the polar face of the surface is grown so as to be parallel to the basal plane, the polar face is not eliminated as the thickness of the film grown increased, making it theoretically impossible to eliminate planar defects.

Further, the presence of the partial polar surface is made unavoidable because the single crystal has defects.

Further, in the compound single crystal substrate of the present invention, the above-described partial polar surface is a polar portion having higher surface energy than the above-described basal plane.

Further, based on the type of elements constituting the polar face, there are a polar face composed of elements having a surface energy higher than that of the basal plane and a polar face composed of elements having a surface energy lower than that of the basal plane. In the compound single crystal of the present invention, the partial polar surface is polar portion with a surface energy higher than that of the basal plane, comprised of elements with a surface energy higher than that of the basal plane.

It is further described below.

For example, in the compound crystal substrate 11 comprising lamination defects shown in FIG. 1(a), the case will be described where crystal is grown on a principal surface in the form of nonpolar face 12, which is the basal plane. The lamination defects present in compound crystalline substrate 11 are exposed as partial surfaces of different angle and polarity from nonpolar face 12, which is the basal plane. There are two types of partial surface. One is polar face 13 with higher surface energy than principal surface 12, and the other is polar face 14 with lower surface energy than principal surface 12. That is, partial surfaces having reversed polarity are present together in the surface.

Figure 1:
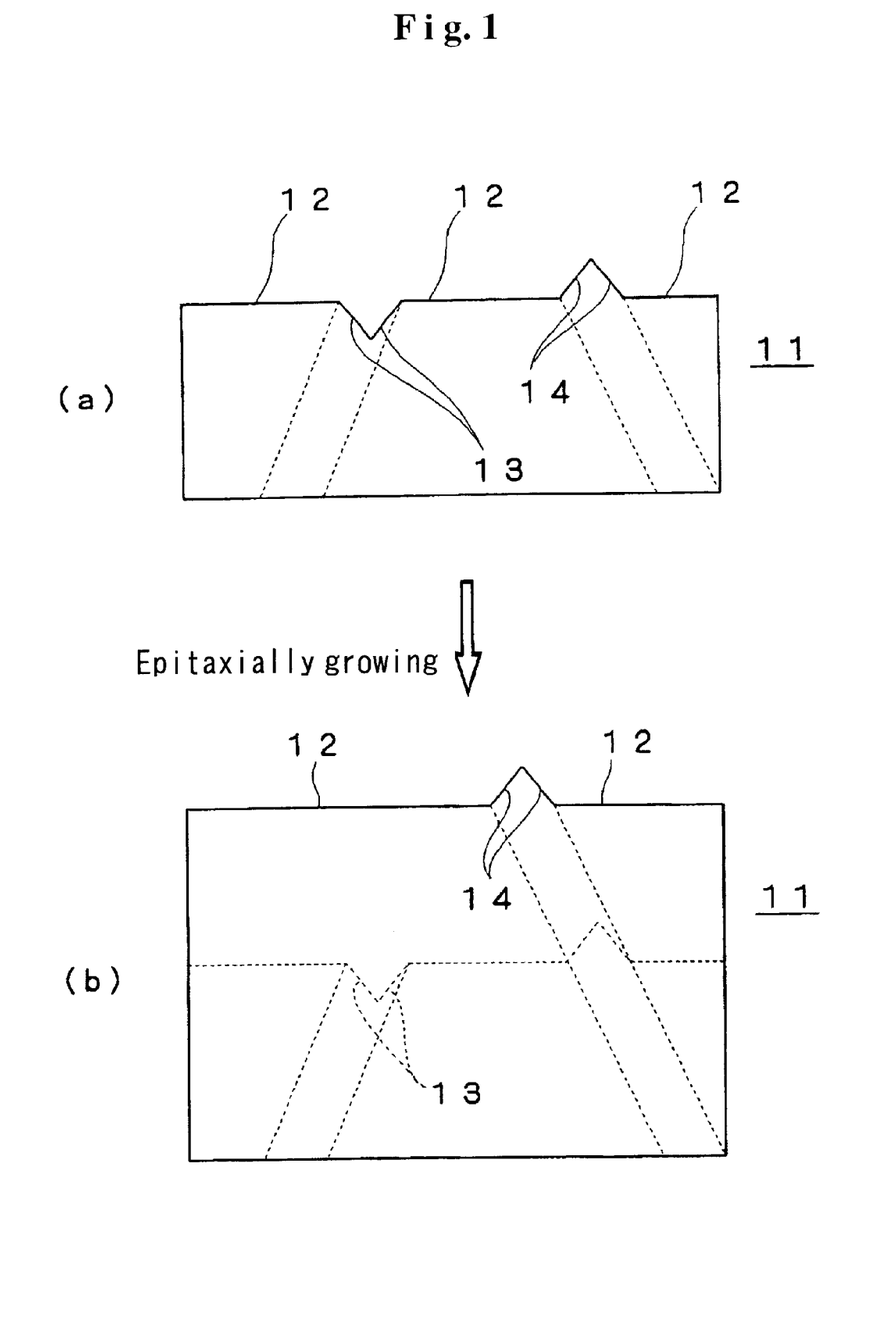
FIG. 1 is a drawing descriptive of the case where a crystal is grown on the basal plane (nonpolar face, principal surface) of a compound crystal substrate comprising lamination defects.

When crystal is grown on a basal plane in the form of principal surface 12 having partial polar surfaces 13 and 14 such as set forth above, as shown in FIG. 1(b), since, on polar face 13 having greater surface energy than principal surface 12, the crystal nucleus generation frequency during the crystal growth process is lower than on the principal surface, the growth rate thereon is lower than on the principal surface. Thus, polar face 13 is buried in the principal surface and then eliminated. On the other hand, polar face 14 with low surface energy has a higher crystal nucleus generation frequency during the crystal growth process than the principal surface, it has a faster crystal growth rate than principal surface 12. Thus, on the final surface that is grown, polar face 14 remains as a partial surface protruding above the principal surface. This condition continues as long as crystal growth is continued, precluding elimination of lamination defects.

Figure 2:
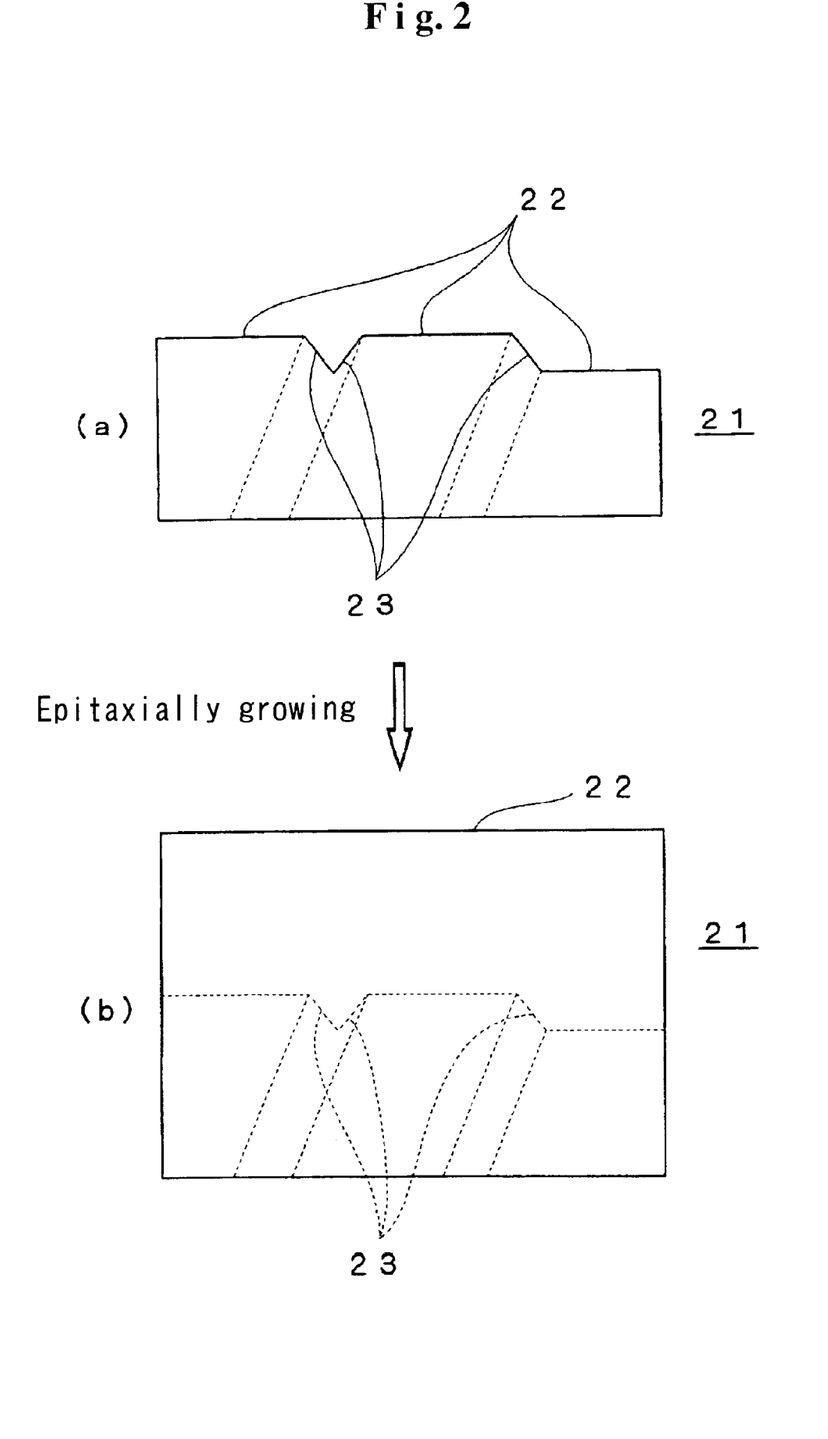
FIG. 2 is a drawing descriptive of the case where a crystal is grown on the surface of the compound single crystal substrate of the present invention.

By contrast, in the present invention, as shown in FIG. 2(a), the surface of compound single crystal substrate 21 is comprised of simply a nonpolar basal plane (principal surface) 22 and a polar face 23 nonparallel to the basal plane (principal surface) 22 and having higher surface energy than principal surface 22. Polar face 23 with high surface energy has a lower crystal growth rate than the nonpolar face (principal surface). Thus, as shown in FIG. 2(b), in the compound single crystal substrate of the present invention, polar face 23 is buried by nonpolar face 22 along with crystal growth. Further, since polar face 23 of the crystal defect surface is not parallel to the principal surface (nonpolar face) serving as basal plane, the opening thereof is closed following burying of the nonpolar face along with crystal growth. As a result, the single crystal obtained does not have surface irregularities that are problematic during device manufacturing.

The compound constituting the compound single crystal substrate of the present invention can be a group IV—IV compound, group III–V compound, or group II–VI compound, for example. More specific examples are compounds (semiconductors) such as GaAs, AlAs, InAs, GaP, GaSb, InP, InSb, ZnS, ZnSe, CdS, CdTe and HgTe. Further, in principle, since the nonpolar face and polar face are not parallel, crystals with any spatial lattice are available; examples are cubic crystal, hexagonal crystal and the like.

More specific examples of substrates that can be employed in the present invention are given below:
(1) A substrate in which the compound single crystal is cubic, the basal plane is (001) face, and the partial polar surface is plane (111) face.
(2) A substrate in which the compound single crystal is hexagonal, the basal plane is (1,1,–2,0) or (1,–1,0,0) face, and the partial polar surface is {0001} faces.
(3) A substrate in which the compound single crystal is cubic silicon carbide, the basal plane is (001) face, and the partial polar surface is (111) Si-face.
(4) A substrate in which the compound single crystal is cubic gallium nitride, the basal plane is (001) face, and the partial polar surface is (111) Ga-face.
(5) A substrate in which the compound single crystal is hexagonal silicon carbide, the basal plane is (1,1,–2,0) or (1,–1,0,0) face, and the partial polar surface is (0001) Si-face.
(6) A substrate in which the compound single crystal is hexagonal gallium nitride, the basal plane is (1,1,–2,0) or (1,–1,0,0) face, and the partial polar surface is (0001) Ga-face.

The above-described compound single crystal substrates of the present invention can be manufactured by the manufacturing method of the present invention disclosed below.

The method of manufacturing the compound single crystal substrate of the present invention comprises the steps of:
(1) epitaxially growing a compound single crystal in the normal direction on a basal plane of a compound single crystal substrate wherein the basal plane is a nonpolar face and has a partial polar surface in a portion thereof,
(2) either cutting the compound single crystal layer that has been grown in parallel to the basal plane, or removing at least said substrate to obtain a compound single crystal block, the basal plane of which is a nonpolar face only having a partial polar surface with the highest surface energy in a portion thereof.

The method of manufacturing the compound single crystal substrate of the present invention will be described based on FIG. 3. First, as shown in (a), a substrate 31 having planar defects and a basal plane in the form of nonpolar face 34 is prepared. The planar defects in the substrate form polar face 32 having a higher surface energy than principal surface 34, and polar face 33 having a lower surface energy than principal surface 34 in the principal surface. On the principal surface of substrate 31, a compound identical to substrate 31 is epitaxially grown without controlling the type of polar surface of the crystal defect surface. As set forth above, a partial polar surface 32 having higher surface energy than the basal plane and a partial polar surface 33 having lower surface energy are both present in the surface that is initially grown. However, with growth of the crystal, as shown in (b), partial polar surface 32 with high surface energy is buried by principal surface 34 that is parallel to the basal plane, and the polar face remaining on the surface is only surface 33 with low surface energy.

Even when further epitaxial growth is conducted on the principal surface of the substrate in the condition shown in (b), the crystal defects cannot be expected to disappear. In the present invention, as shown in (c), the epitaxially grown layer obtained above is sliced parallel to the basal plane. Only a surface 36 parallel to the basal plane and a polar face 32 with high surface energy are present in the sliced surface 36 of the plate 35 obtained by slicing the layer that has been grown. This is because, based on crystallography, the reversed polar faces are arranged together with mirror symmetry. The crystal can be sliced by a known method, such as use of a diamond saw.

Alternatively, instead of slicing, a material in which only surface 36 parallel to the basal plane and polar face 32 with high surface energy are present can be obtained by removing at least said substrate 31 by grinding, etching or the like.

The above-mentioned cutting by slicing, grinding, etching or the like is suitably conducted in the portion of film thickness in which the tendency toward reduction in defect density relative to film thickness is saturated. For example, referencing the changes in etch pit density shown in the comparative examples, slicing or the like is suitably conducted at spots where the film thickness is equal to or greater than that of a certain etch pit density. A partial polar surface contained in the surface obtained by slicing or the like at such spots is composed of only polar portions with higher surface energy than that of the basal plane.

The above-mentioned substrate of the present invention can be manufactured by slicing the epitaxially grown layer in this manner, or removing at least said substrate 31. When epitaxial growth is conducted on the surface of the substrate obtained in this manner, the polar face on the new surface is basal plane prevented from propagating while buried by the principal surface parallel to the basal plane. Thus, as shown in (d), a high-quality single crystal substrate 37 is obtained that does not contain crystal defects and that can be employed in the manufacture of semiconductor devices.

The present invention also involves laminates having compound single crystal layers that are homogeneous or heterogeneous with the above-described substrate on the basal plane of the compound single crystal substrate of the present invention described above. They are characterized in that the single crystal constituting said compound single crystal layer has crystallinity and a spatial lattice that are homogeneous with those of said substrate, the principal surface of said compound single crystal layer is a nonpolar basal plane, and, in said nonpolar basal plane, an area occupied by a partial surface having surface polarity and nonparallel to said basal plane is 0.1 percent or less of the total area of the basal plane. These laminates can be manufactured by epitaxially growing a compound single crystal layer that is homogeneous or heterogeneous with the compound constituting said single crystal substrate on the basal plane of the compound single crystal substrate of the present invention.

As set forth above, in the compound single crystal substrate of the present invention, the basal plane is a nonpolar face and said basal plane has a partial polar surface in a portion thereof. This partial polar surface is not parallel to the basal plane and is comprised of elements with higher surface energy than that of the basal plane. Thus, the epitaxial growing of a compound single crystal layer that is homogeneous or heterogeneous with the substrate on the base substrate (principal surface) of the compound single crystal substrate yields a laminate having a nonpolar basal plane as a principal surface in which an area occupied by the partial surface (this partial surface is nonparallel to the basal plane) having crystallinity and a spatial lattice that are homogeneous with those of the substrate as well as having surface polarity and nonparallel to the basal plane.

The advantages of the laminate will be described.

(1) When the upper layer film being laminated cannot be made thick (for example, when the growth rate of the film is low, when there is a limit to the thickness of the film being laminated (on-specific resistance of the device decreases), the upper layer can be laminated onto a suitable substrate to impart mechanical strength to the film.

(2) When fabricating a laminate in which an upper layer is laminated over a suitable substrate, such as in pn junctions and heterojunctions, the effects of the interface between the laminated film (upper layer) and underlayer (substrate) can be utilized.

(3) In homogeneous compound single crystals, there is an advantage that the crystallinity of the laminated layer is better than that of the substrate.

In heterogeneous compound single crystal, a laminate may be employed as it is, or the upper layer may be cut away from the substrate for use. However, laminates are generally employed as it is.

When the substrate and the compound single crystal layer are homogeneous compound single crystals, the single crystal constituting the compound single crystal layer has crystallinity and spatial lattice homogeneous with those of the substrate.

Examples of such substrates are those obtained by growing, on (001) face of GaAs, 3C—SiC, GaP, InP, GaN, or InSb, (001) face homogeneous therewith.

Even when the substrate and the compound single crystal layer are heterogeneous compound single crystals, the single crystal constituting the compound single crystal layer have crystallinity and spatial lattice homogeneous with the substrate. Here, the spatial lattice refers to the type of atomic arrangement of the unit structure constituting the crystal. For example, cubic or hexagonal corresponds thereto. Having identical crystallinity and spatial lattice means, for example, that if the underlayer substrate is cubic (001) face, the homogeneous or heterogeneous layer epitaxially grown as the upper layer is also cubic (001) face. If the substrate is hexagonal (0001) face, the upper layer is also hexagonal (0001) face. If the substrate is hexagonal (0,0,0,-1) face, the upper layer is also hexagonal (0,0,0,-1) face. If the substrate is hexagonal (1,1,-2,0) face, the upper layer is also hexagonal (1,1,-2,0) face. If the substrate is cubic (111) face, the upper layer is also cubic (111) face. And if the substrate is cubic (-1,-1,-1) face, the upper layer is also cubic (-1,-1,-1) face.

Examples of such laminates are a laminate with a substrate in the form of silicon carbide and an upper layer laminated thereover in the form of a gallium nitride layer (for example, a laminate having a substrate in the form of hexagonal SiC (0001) face and an upper layer laminated thereover in the form of hexagonal GaN (0001) face and a laminate with a substrate in the form of cubic TiC (001) face and an upper layer laminated thereover in the form of cubic SiC (001) face.

By using the substrate of the present invention, for example, obtained is a mirror surface compound crystal in which an area occupied by the polar face is 0.1 percent or less of the total surface area of the surface in which the principal surface is present. Further, by using the substrate of the present invention, it is possible to manufacture a compound semiconductor substrate in which the crystal defect density exposed on the substrate surface is $0.1/cm^2$ or less. Further, when a semiconductor device having a surface area of 1 $cm^2$ on the compound semiconductor substrate obtained is manufactured, the yield of not less than 90 percent is achieved.

The reverse breakdown voltage of the semiconductor device that is manufactured is one order or more greater, and the leakage electricity is reduced by two order or less, relative to conventional substrates. For example, in the case of a Schottky barrier diode, a Schottky contact is formed on the compound semiconductor surface of the present invention, and a depth of up to about 10 $\mu$m of the compound semiconductor surface functions as the device active layer (the depth to which the depletion layer extends when a reverse bias is applied). In this case, when there are defects extending from the active layer to the underlayer, partial current paths are generated within the depletion layer and the reverse breakdown voltage that should originally have been determined by the width of the depletion layer decreases, and a reverse current that should not be flowing at all during reverse application ends up flowing. The leakage current is thought to be proportionate to the defect density in the depletion layer, but since defects in the compound semiconductor surface are reduced by a factor of more than 100 relative to conventional products (the comparative examples) in the present invention, the leakage voltage can be reduced by more than a factor of 100. Further, the fact that there are no defects having polar faces means that there are few irregularities on the surface, and since electrical field concentration no longer takes place in corners during reverse application, an improved reverse breakdown voltage is achieved.

EXAMPLES

The present invention is described in greater detail below based on Comparative Examples and Examples.

Comparative Example 1

An Si (001) substrate was treated for 10 min with 5 percent diluted hydrofluoric acid, before the SiC growth on it. The SiC growth was divided into the steps of carbonizing the substrate surface and growing SiC by alternately supplying source gases. During the carbonizing step, the substrate that had been processed as described above was heated for 120 min from room temperature to 1,050° C. in an acetylene atmosphere (see Table 1). In the carbonizing step, about 10 nm of 3C—SiC was grown by multinuclear growth on the Si substrate. In this process, since the 3C—SiC assumed the crystallinity of the substrate Si, Si (001) face was parallel to the nonpolar (001) face. However, since 3C—SiC (111) face (Si face) and 3C—SiC (-1,-1,-1) face (C face) respectively had identical probabilities of orientating to four orientations parallel to Si {111} faces, in the SiC growing step shown in Table 2 (alternately exposing the substrate surface to dichlorosilane and acetylene at 1,050° C. and growing SiC), the boundary layer (APB, Anti-Phase boundary) of the 3C—SiC (111) face (Si face) and the 3C—SiC (-1,-1,-1) face (C face) propagated along the Si [111] orientation. Further, high density twins were contained in the 3C—SiC formed during the carbonizing step. In this case, the twins exposed in the (001) surface formed a facet (corresponding to (115) face of the basal plane) intersecting (001) face at an angle of about 16°, while exposed on the surface as steps in 3C—SiC (111) face (Si face) or 3C—SiC (-1,-1,-1) face (C-face). However, since the exposed portion of 3C—SiC (-1,-1,-1) face (C-face) had surface energy lower than that of 3C—SiC (001) face or 3C—SiC (111) face (Si face), a locally high growth rate was exhibited. On the other hand, since 3C—SiC (111) face (Si face) had a growth rate lower than that of 3C—SiC (001) face, which was a nonpolar face, it disappeared along with growing. Accordingly, only the 3C—SiC (-1,-1,-1) face (C-face) remained as a polar face in the 3C—SiC surface that had grown to some degree. However, since 3C—SiC (-1,-1,-1) face (C-face) had an equal probability of orientating to orientations [110], [1,-1,0 ], [-1,-1,0] and [-1,1,0], it did not disappear completely no matter how thick the film was made.

TABLE 1

Carbonization Conditions

| | |
|---|---|
| Carbonization temperature | 1,050° C. |
| Acetylene introduction temperature | 24° C. |
| Acetylene flow rate | 10 sccm |
| Pressure | 20 mTorr |
| Period of temperature increase | 120 min |

TABLE 2

SiC Growth Conditions

| | |
|---|---|
| Growth temperature | 1,050° C. |
| Gas supply method | Alternate feeding of acetylene and dichlorosilane |
| Acetylene flow rate | 10 sccm |
| Dichlorosilane flow rate | 10 sccm |
| Interval of feeding each gas | 5 sec |
| Feeding time of each gas | 10 sec |
| Maximum pressure | 100 mTorr |
| Minimum pressure | 10 mTorr |
| Number of gas feeding cycles | 100–50,000 cycles (the thickness of the 3C-SiC film was controlled by the number of cycles) |

Figure 3:
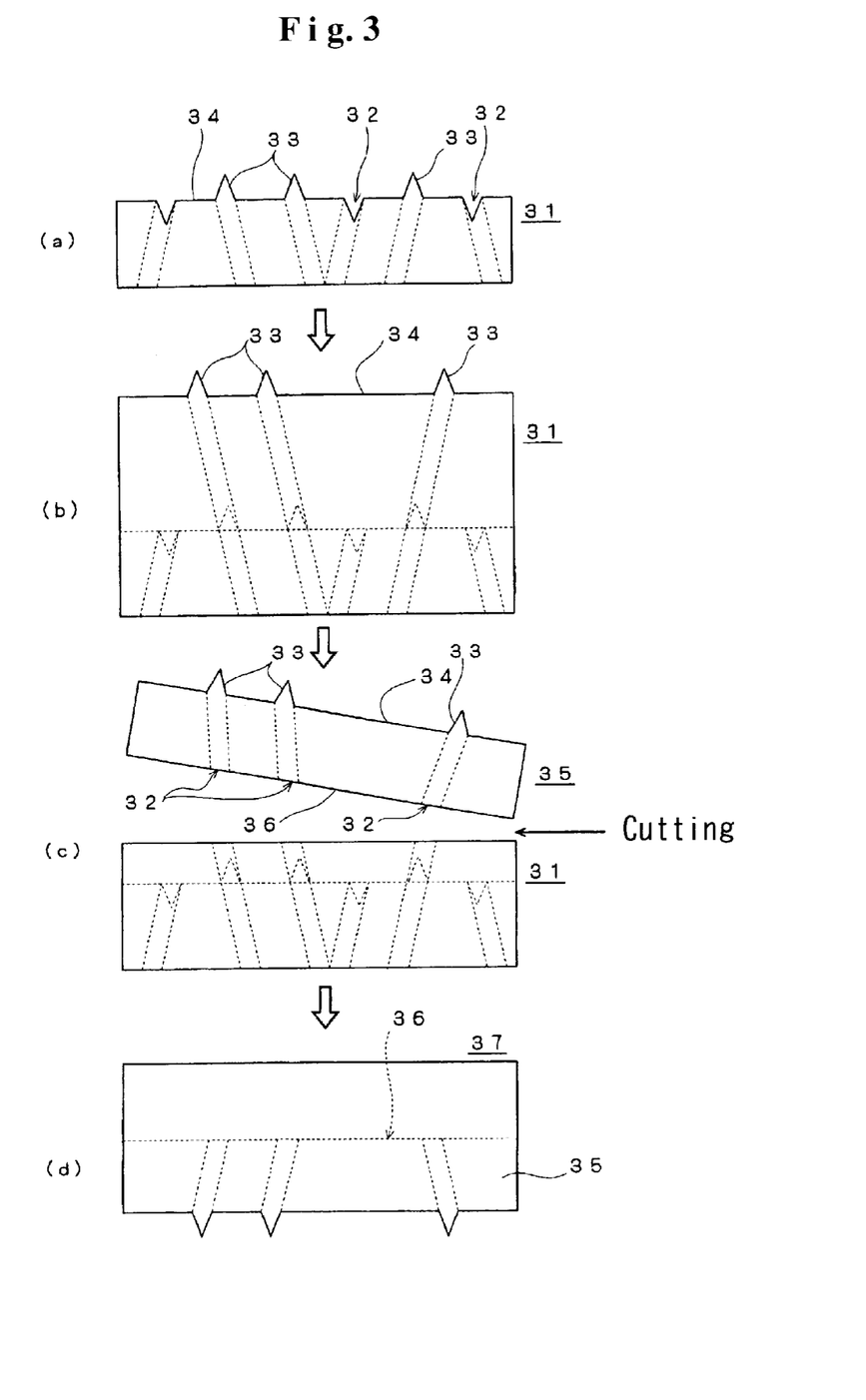
FIG. 3 is a drawing descriptive of the method of manufacturing a compound single crystal substrate of the present invention.

Accordingly, when the 3C—SiC film thickness was changed by means of the number of gas feeding cycles, for example, as shown in FIG. 3, the tendency of decreasing planar defects exposed on the surface becomes slow. The planar defects exposed on the surface in this process were observed as etch pit density (counted by optical microscopy) produced in the course of contacting for 5 min the grown surface with 500° C. molten KOH.

Further, a Ni electrode with 200 $\mu m \phi$ was evaporated on the 300 $\mu m$ of 3C—SiC thus formed, and the Ni/3C—SiC Schottky contact characteristics thereof were measured. The reverse breakdown voltage was 3 V, the ideal factor was 1.8, and the leakage current when a reverse voltage of 1 V was applied was 0.3 mA/cm$^2$. These characteristics were considered inadequate.

TABLE 3

The relation between SiC film thickness and planar defect density

| Film thickness ($\mu m$) | Density of planar defects exposed on surface (cm$^{-2}$) |
|---|---|
| 0.1 | 5 × 10$^9$ |
| 0.4 | 6 × 10$^7$ |
| 1.0 | 1 × 10$^7$ |
| 1.8 | 7 × 10$^6$ |
| 2.5 | 7 × 10$^6$ |
| 3.5 | 7 × 10$^6$ |
| 5.5 | 7 × 10$^6$ |
| 10 | 7 × 10$^6$ |
| 50 | 7 × 10$^6$ |
| 80 | 7 × 10$^6$ |
| 100 | 7 × 10$^6$ |
| 150 | 7 × 10$^6$ |
| 200 | 7 × 10$^6$ |
| 300 | 7 × 10$^6$ |

Example 1

Using Comparative Example 1, 3C—SiC grown to 300 $\mu m$ was cut along a plane parallel to Si (001) that was the basal plane. A diamond saw was used for cutting and the cutting position was a position apart 100 $\mu m$ from 3C—SiC/Si interface to the orientation [001] of the 3C—SiC side. That is, the planar defect density of the cutting surface was equal to the value at a film thickness of 100 $\mu m$ shown in Table 3, namely 7×10$^6$/cm$^2$. The 3C—SiC (001) surface that was cut in this manner was ground with a diamond slurry, the (001) surface was exposed, and this was employed as a new surface. In this process, since 3C—SiC (-1,-1,-1) face (C-face) and 3C—SiC (111) face (Si face) were crystallographically right angled to each other, a polar face exposed on the new 3C—SiC surface was coalesced into 3C—SiC (111) face (Si face) with high surface energy. When this surface was employed again to grow 3C—SiC under the conditions of Table 2, the planar defects in the surface relative to the increase in film thickness ($\Delta$t) over the initial film thickness, as shown in Table 5, exhibited a marked tendency to decrease, and planar defects completely disappeared at a total film thickness of 205 $\mu m$. The method used to measure planar defect density was identical to that in Comparative Example 1.

TABLE 4

Change in planar defect density as a function of film thickness in Example 1

| Increase of film thickness $\Delta$t ($\mu m$) | Density of planar defects exposed on surface (cm$^{-2}$) |
|---|---|
| 1 | 3 × 10$^6$ |
| 2 | 1 × 10$^6$ |
| 3 | 4 × 10$^3$ |
| 4 | 300 |
| 5 | 0 |
| 6 | 0 |
| 7 | 0 |
| 8 | 0 |
| 9 | 0 |
| 10 | 0 |

A Ni electrode with 200 $\mu m \phi$ was evaporated over the 3C—SiC thus formed and the Ni/3C—SiC Schottky characteristics were measured. Good diode characteristics were achieved in the form of a reverse breakdown voltage of 1,100 V, an ideal factor of 1.11, and a leakage current when a reverse voltage of 10 V was applied of 10 nA/cm$^2$.

Based on the above results, the effect of the present invention was confirmed with regard to the manufacturing of a high-quality 3C—SiC substrate for semiconductor device manufacturing.

Comparative Example 2

A substrate in the form of a 3C—Si (001) face (defect density of 7×10⁶) grown to 100 µm on Si (001) face was treated with 5 percent diluted hydrofluoric acid for 10 min, after which cubic GaN was grown. A low pressure MOCVD system was employed to grow the GaN. The growth temperature was 1,000° C. Trimethyl gallium (Ga(CH₃)₃) and ammonia (NH₃) were introduced at 10 sccm and 50 sccm, respectively, and while diluting with 300 sccm of H₂, growth was conducted under a vacuum of 100 mTorr. The growth rate was 1.5 µm/hour, and the film thickness of the cubic GaN film was changed by means of the growth time. In this process, since the cubic GaN (111) face (Ga face) and cubic GaN (-1,-1,-1) face (N face) each had equal probabilities of orientating to four equivalent orientations parallel to Si (111) face, during growth, the boundary layer (APB, Anti-Phase boundary) of GaN (111) face (Ga face) and GaN (-1,-1,-1) face (N face) propagated along the Si [111] direction. Further, the high-density twins produced along the SiC/GaN interface also similarly propagated in parallel to (111) face. In this case, the GaN twins exposed on the (001) surface formed a facet (corresponding to (115) face of the basal plane) intersecting (001) face at an angle of about 16°, while exposed as steps of GaN (111) face (Ga face) or GaN (-1,-1,-1) face (N face) on the surface. However, since the exposed portions of GaN (-1,-1,-1) face (N face) had surface energy lower than that of GaN (001) face and GaN (111) face (Ga faces), they exhibited locally high growth rates.

Further, since GaN (111) face (Ga face) grew more slowly than Ga (001) face that was a nonpolar face, it disappeared along with growth. Accordingly, after a certain degree of growth, only GaN (-1,-1,-1) face (Ga face) remained as the polar face of the GaN surface, the probability of planar defects association decreased, and as shown in Table 5, the planar defect elimination effect relative to the film thickness became slow. The planar defect density of the cubic GaN surface was obtained by counting by optical microscopy the etch pits generated during etching for 2 hours in phosphoric acid at 80° C.

TABLE 5

The relation between cubic GaN film thickness and planar defect density in Comparative Example 2

| Film thickness (µm) | Density of planar defects exposed on surface (cm⁻²) |
| --- | --- |
| 0.1 | 5.6 × 10¹² |
| 0.4 | 2.3 × 10¹¹ |
| 1.0 | 4.1 × 10¹⁰ |
| 1.8 | 3.6 × 10⁹ |
| 2.5 | 2.4 × 10⁸ |
| 3.5 | 1.7 × 10⁸ |
| 5.5 | 1.6 × 10⁸ |
| 10 | 1.3 × 10⁸ |
| 50 | 1.3 × 10⁸ |
| 80 | 1.3 × 10⁸ |
| 100 | 1.3 × 10⁸ |
| 150 | 1.2 × 10⁸ |
| 200 | 1.2 × 10⁸ |
| 300 | 1.0 × 10⁸ |

Further, a Pt electrode with 200 µmφ was evaporated on the cubic GaN surface that had been grown in this manner to a thickness of 300 µm. The Pt/GaN Schottky contact characteristics were measured. Inadequate diode characteristics were obtained in the form of a reverse breakdown voltage of 20 V, an ideal factor 1.58, and a leakage current of 0.2 mA/cm² when a reverse voltage of 1 V was applied.

Example 2

Using Comparative Example 2, cubic GaN grown to 300 µm was cut along a plane parallel to Si (001) that was a basal plane. A diamond saw was used for cutting and the cutting position was a position apart 100 µm from GaN/3C—SiC interface to the orientation [001] of the cubic GaN side. That is, the planar defect density of the cutting surface was equal to the value at a film thickness of 100 µm shown in Table 5, namely 1.3×10⁸/cm². The cubic GaN (001) face that was cut in this manner was ground, the (001) surface was exposed, and this was employed as a new surface. In this process, since cubic GaN (-1,-1,-1) face (N face) and cubic GaN (111) face (Ga face) were crystallographically right angled to each other, a polar face exposed on the new cubic GaN surface was coalesced into the cubic GaN (111) face (Ga face) with high surface energy. When this surface was employed again to grow cubic GaN under the conditions of Comparative Example 2, the planar defects in the surface relative to the increase in film thickness (Δt) over the initial film thickness, as shown in Table 6, exhibited a marked tendency to decrease, and planar defects completely disappeared at a total film thickness of 234 µm. The method used to measure the planar defect density of the cubic GaN surface in this Example was identical to that in Comparative Example 2.

TABLE 6

Change in planar defect density in cubic GaN surface as a function of film thickness in Example 2

| Increase of film thickness Δt (µm) | Planar defect density on surface (cm⁻²) |
| --- | --- |
| 1 | 1.0 × 10⁸ |
| 2 | 5.8 × 10⁶ |
| 4 | 8.4 × 10⁴ |
| 8 | 3800 |
| 15 | 420 |
| 20 | 72 |
| 25 | 5 |
| 30 | 2 |
| 34 | 0 |
| 40 | 0 |

A Pt electrode with 200 µmφ was evaporated over a cubic GaN surface thus formed to a thickness of 140 µm and the Pt/GaN Schottky contact characteristics were measured. Good diode characteristics were achieved in the form of a breakdown voltage of 480 V, an ideal factor of 1.22, and a leakage current when a reverse voltage of 10 V was applied of 32 nA/cm².

Based on the above results, the effect of the present invention was confirmed with regard to the growth of cubic GaN.

Comparative Example 3

4H—SiC was homoepitaxially grown on the surface of a 4H—SiC substrate having a basal plane in the form of (1,1,-2,0) face manufactured by a sublimation method. However, 3.6×10⁷/cm² of planar defects were exposed on the initial 4H—SiC surface. Under the conditions given in Table 2, 4H—SiC was homoepitaxially grown on the 4H—SiC substrate while measuring by the same means as in Comparative Example 1 the change in planar defect density relative to the increase in film thickness (Δt). As shown in Table 7, the elimination effect on planar defects relative to the increase in film thickness in the present comparative example was slow. Although homoepitaxial growth was continued to 100 μm, there were $3.1 \times 10^7/cm^2$ planar defects in the surface.

TABLE 7

Change in planar defect density as a function of 4H—SiC film thickness in Comparative Example 3

| Increase of film thickness Δt (μm) | Density of planar defects exposed on surface (cm$^{-2}$) |
|---|---|
| 1 | $3.2 \times 10^7$ |
| 2 | $3.2 \times 10^7$ |
| 3 | $3.2 \times 10^7$ |
| 4 | $3.1 \times 10^7$ |
| 5 | $3.1 \times 10^7$ |
| 10 | $3.1 \times 10^7$ |
| 20 | $3.1 \times 10^7$ |
| 50 | $3.1 \times 10^7$ |
| 100 | $3.1 \times 10^7$ |
| 500 | $3.1 \times 10^7$ |

Further, a Au electrode with 200 μmφ was evaporated on the 4H—SiC homoepitaxially grown layer surface that had been grown in this manner to a thickness of 500 μm. The Au/4H—SiC Schottky contact characteristics were measured. However, inadequate diode characteristics were obtained in the form of a reverse breakdown voltage of 8 V, an ideal factor of 1.75, and a leakage current of 0.2 mA/cm$^2$ when a reverse voltage of 1 V was applied.

Example 3

Using Comparative Example 3, 4H—SiC grown to 100 μm was cut along a plane parallel to (1,1,-2,0) face that was a basal plane. A diamond saw was used for cutting and the cutting position was a position apart 100 μm from the growth interface to the orientation [1,1,-2,0] of the homoepitaxial 4H—SiC side. That is, the planar defect density of the cutting surface was equal to the value shown in Table 7, namely $3.1 \times 10^7/cm^2$. The cutting surface of the 4H—SiC (1, 1,-2,0) face that was cut in this manner was ground with a diamond slurry and employed as a new surface. In this process, since 4H—SiC (0,0,0,-1) face (C-face) and 4H—SiC (0001) face (Si face) were crystallographically right angled to each other, a polar face not parallel to the principal surface exposed on the new 4H—SiC surface was coalesced into 4H—SiC (0001) face (Si face) with high surface energy. When this surface was employed again to grow 4H—SiC under the conditions of Table 2, the planar defects in the surface, as shown in Table 8, exhibited a marked tendency to decrease with the increase in film thickness (Δt) over the initial film thickness, and the planar defects disappeared completely at Δt=4 μm. The method used to measure the planar defect density was identical to that in Comparative Example 1.

TABLE 8

Change in planar defect density as a function of 4H—SiC film thickness in Example 3

| Increase of film thickness Δt (μm) | Density of planar defects exposed on surface (cm$^{-2}$) |
|---|---|
| 1 | $7.2 \times 10^5$ |
| 2 | $4.8 \times 10^3$ |
| 3 | 640 |
| 4 | 0 |
| 5 | 0 |
| 6 | 0 |
| 7 | 0 |
| 8 | 0 |
| 9 | 0 |
| 10 | 0 |

A Au electrode with 200 μmφ was evaporated over the 4H—SiC (Δt=5 μm) thus formed and the Au/4H—SiC Schottky contact characteristics were measured. Good diode characteristics were achieved in the form of a reverse breakdown voltage of 3,700 V, an ideal factor of 1.08, and a leakage current when a reverse voltage of 10 V was applied of 10 nA/cm$^2$.

Based on the above results, the effect of the present invention was confirmed with regard to the manufacturing of a high-quality 4H—SiC substrate for manufacturing conductor devices.

Comparative Example 4

While heteroepitaxially growing hexagonal GaN under the conditions of Comparative Example 2 on the surface of a 4H—SiC substrate having a basal plane in the form of (1,1,-2,0) face manufactured by a sublimation method, changed in planar defect density relative to increase in film thickness (Δt) were measured by the same means as in Comparative Example 2. As shown in Table 9, the elimination effect on planar defects relative to the increase in film thickness in the present comparative example was slow. Although epitaxial growth was continued to 300 μm, there were $1.7 \times 10^7/cm^2$ planar defects in the surface.

TABLE 9

Change in planar defect density as a function of hexagonal GaN film thickness in Comparative Example 4

| Increase of film thickness Δt (μm) | Density of planar defects exposed on surface (cm$^{-2}$) |
|---|---|
| 1 | $3.3 \times 10^7$ |
| 2 | $2.6 \times 10^7$ |
| 3 | $2.0 \times 10^7$ |
| 5 | $1.9 \times 10^7$ |
| 10 | $1.9 \times 10^7$ |
| 20 | $1.8 \times 10^7$ |
| 50 | $1.8 \times 10^7$ |
| 100 | $1.8 \times 10^7$ |
| 200 | $1.7 \times 10^7$ |
| 300 | $1.7 \times 10^7$ |

Further, a Pt electrode with 200 μmφ was evaporated on the hexagonal GaN grown layer surface grown in this manner to a thickness of 300 μm. The Pt/hexagonal GaN Schottky contact characteristics were measured. However, inadequate diode characteristics were obtained in the form of a reverse breakdown voltage of 12 V, an ideal factor of 1.91, and a leakage current of 0.7 mA/cm$^2$ when a reverse voltage of 1 V was applied.

Example 4

Using Comparative Example 4, hexagonal GaN grown to 300 μm was cut along a plane parallel to (1,1,-2,0) face that was a basal plane. A diamond saw was used for cutting and the cutting position was a position apart 100 μm from the growth interface to the orientation [1,1,-2,0] of the heteroepitaxial hexagonal GaN side. That is, the planar defect density of the cutting surface was equal to the value shown in Table 10, namely $1.8 \times 10^7/cm^2$. The cutting surface of the hexagonal GaN (1,1,-2,0) face that was cut in this manner was ground with a diamond slurry and employed as a new surface. In this process, since hexagonal GaN (0,0,0,-1) face (N face) and hexagonal GaN (0001) face (Ga face) were crystallographically right angled to each other, a polar face not parallel to the principal surface exposed on the new hexagonal GaN surface was coalesced into hexagonal GaN (0001) face (Ga face) with high surface energy. When this surface was employed again to grow hexagonal GaN under the conditions of Comparative Example 2, the planar defects in the surface relative to the increase in film thickness (Δt) over the initial film thickness, as shown in Table 10, exhibited a marked tendency to decrease, and planar defects disappeared completely at Δt=8 μm. The method used to measure the planar defect density was identical to that in Comparative Example 2.

TABLE 10

Change in planar defect density as a function of hexagonal GaN film thickness in Example 5

| Increase of film thickness Δt (μm) | Density of planar defects exposed on surface (cm$^{-2}$) |
| --- | --- |
| 1 | $6.3 \times 10^6$ |
| 2 | $6.1 \times 10^5$ |
| 3 | $1.0 \times 10^4$ |
| 4 | 4862 |
| 5 | 1203 |
| 6 | 820 |
| 7 | 191 |
| 8 | 0 |
| 9 | 0 |
| 10 | 0 |

A Pt electrode with 200 μmφ was evaporated over the hexagonal GaN (Δt=10 μm) thus formed and the Pt/hexagonal GaN Schottky contact characteristics were measured. Good diode characteristics were achieved in the form of a reverse breakdown voltage of 1,200 V, an ideal factor of 1.25, and a leakage current when a reverse voltage of 10 V was applied of 10 nA/cm$^2$.

Based on the above results, the effect of the present invention was confirmed with regard to the manufacturing of a high-quality hexagonal GaN substrate for manufacturing semiconductor devices.

Comparative Example 5

3C—SiC grown to 300 μm using Comparative Example 1 was employed as a basal plane. This surface was treated with 5 percent diluted hydrofluoric acid for 10 min, prior to the cubic GaN growth. A low pressure MOCVD system was employed to grow the GaN. The growth temperature was 1,000° C. Trimethyl gallium (Ga(CH$_3$)$_3$) and ammonia (NH$_3$) were introduced at 10 sccm and 50 sccm, respectively, and while diluting with 300 sccm of H$_2$, growth was conducted under a vacuum of 100 mTorr. The growth rate was 1.5 μm/hour, and the film thickness of the cubic GaN film was changed by means of the growth time. In this process, since the 3C—SiC (-1,-1,-1) face (C-face) was present on portions of the substrate surface, cubic GaN (-1,-1,-1) face (Ga face) grew preferentially on the C-face. Thus, the 3C—SiC twin surfaces (C-face) serving as substrate was assumed to the GaN layer, and similarly propagated in parallel with (111) face as the 3C—SiC. In this case, the GaN twins exposed on the (001) surface formed a facet (corresponding to (115) face of the basal plane) intersecting (001) face at an angle of about 16°, while exposed as GaN (11) face (Ga face) steps on the surface. However, since the exposed portion of GaN (-1,-1,-1) face (N face) had lower surface energy than GaN (001) face and GaN (111) face (Ga faces), high growth rates were locally exhibited. Accordingly, the probability of planar defects association decreased, and as shown in Table 11, the elimination effects of planar defects relative to film thickness decreased. The planar defect density of the cubic GaN surface was obtained by counting by optical microscopy the etch pits generated by etching for 2 hours in phosphoric acid at 80° C.

TABLE 11

The relation between cubic GaN film thickness and planar defect density in Comparative Example 5

| Film thickness (μm) | Density of planar defects exposed on surface (cm$^{-2}$) |
| --- | --- |
| 0.1 | $6.1 \times 10^{12}$ |
| 0.4 | $4.3 \times 10^{10}$ |
| 1.0 | $4.1 \times 10^9$ |
| 1.8 | $9.6 \times 10^8$ |
| 2.5 | $3.3 \times 10^8$ |
| 3.5 | $3.3 \times 10^8$ |
| 5.5 | $3.3 \times 10^8$ |
| 10 | $3.3 \times 10^8$ |
| 50 | $3.3 \times 10^8$ |
| 80 | $3.3 \times 10^8$ |
| 100 | $3.3 \times 10^8$ |
| 150 | $3.3 \times 10^8$ |
| 200 | $3.1 \times 10^8$ |
| 300 | $3.1 \times 10^8$ |

Further, a Pt electrode with 200 μmφ was evaporated on the cubic GaN surface grown in this manner to a thickness of 300 μm. The Pt/GaN Schottky contact characteristics were measured. However, inadequate diode characteristics were obtained in the form of a reverse breakdown voltage of 20 V, an ideal factor of 1.58, and a leakage current of 0.2 mA/cm$^2$ when a reverse voltage of 1 V was applied.

Example 5

Using Comparative Example 1, 3C—SiC grown to 300 μm was cut along a plane parallel to Si (001) that was a basal plane. A diamond saw was used for cutting and the cutting position was a position apart 100 μm from the 3C—SiC/Si interface to the orientation [001] of the 3C—SiC side. That is, the planar defect density of the cutting surface was equal to the value at a film thickness of 100 μm shown in Table 3, namely $7 \times 10^6/cm^2$. The cutting surface of the 3C (001) face that was cut in this manner was ground with a diamond slurry, the (001) surface was exposed, and this was employed as a new surface. In this process, since 3C—SiC (111) face (Si face) was present the substrate surface, cubic GaN (111) face (Ga face) grew preferentially on the Si face. However, since the portion of GaN (111) face (Ga face) exposed on the surface had a lower surface energy than GaN (001) face, locally low growth rates were exhibited. Accordingly, as the GaN grew, it was buried by GaN (001) face, and as shown in Table 12, the elimination effect on planar defects relative to film thickness became slow. The planar defect density of the cubic GaN surface was obtained by counting by optical microscopy the etch pits produced by etching for 2 hours with phosphoric acid at 80° C.

TABLE 12

The relation between cubic GaN film thickness and planar defect density in Example 5

| Film thickness ($\mu$m) | Density of planar defects exposed on surface (cm$^{-2}$) |
|---|---|
| 0.1 | $4.7 \times 10^{12}$ |
| 0.4 | $8.2 \times 10^{11}$ |
| 1.0 | $5.1 \times 10^{10}$ |
| 1.8 | $7.7 \times 10^{9}$ |
| 2.5 | $6.9 \times 10^{8}$ |
| 3.5 | $3.1 \times 10^{8}$ |
| 5.5 | $9.4 \times 10^{6}$ |
| 10 | $1.3 \times 10^{5}$ |
| 50 | $2.8 \times 10^{3}$ |
| 80 | 1200 |
| 100 | 867 |
| 150 | 36 |
| 200 | 0 |
| 300 | 0 |

A Pt electrode with 200 $\mu$m$\phi$ was evaporated over the cubic GaN surface grown to 300 $\mu$m in this manner and the Pt/GaN Schottky contact characteristics were measured. Good diode characteristics were achieved in the form of a reverse breakdown voltage of 540 V, an ideal factor of 1.16, and a leakage current when a reverse voltage of 10 V was applied of 21 nA/cm$^2$. Based on the above results, the effect of the present invention was confirmed with regard to growing cubic GaN on a 3C—SiC substrate.

The present invention has been described through the examples of SiC and GaN in the Examples. However, the substrate of the present invention can be obtained in any compound single crystal in which there is a relation where one of the polar faces, based on its defects, has a higher surface energy than the nonpolar face, and the surface energy of the other polar face is lower than that of the nonpolar face.

The polar face of the single crystal surface, for example, can be determined by measuring the ratio of the adhesion coefficients to each of the polar faces, or empirically determined using a surface potential scanning microscope.

The present disclosure relates to the subject matter contained in Japanese Patent Application No. 2001-139926 filed on May 10, 2001, which is expressly incorporated herein by reference in its entirety.

What is claimed is:

1. A method of manufacturing a compound single crystal substrate, a basal plane of which is a nonpolar face and said basal plane has a partial polar surface that is a polar portion with surface energy higher than said basal plane, said method comprising the steps of:

epitaxially growing a compound single crystal in the normal direction on a basal plane of a compound single crystal substrate wherein the basal plane is a nonpolar face and has a partial polar surface in a portion thereof, and either cutting the compound single crystal layer that has been grown in parallel to the basal plane, or removing at least said substrate to obtain a compound single crystal block, a basal plane of which is a nonpolar face only having a partial polar surface with the highest surface energy in a portion thereof.

2. A method of manufacturing a compound single crystal laminate, characterized in that a compound single crystal layer that is homogeneous or heterogeneous with a compound constituting a single crystal substrate is epitaxially grown on a basal plane of a compound single crystal substrate the basal plane of which is a nonpolar face and said basal plane has a partial polar surface that is a polar portion with surface energy higher than said basal plane.

* * * * *